United States Patent
Sasaki et al.

(10) Patent No.: US 6,452,087 B2
(45) Date of Patent: Sep. 17, 2002

(54) PHOTOVOLTAIC DEVICE AND METHOD OF FABRICATING THE SAME

(75) Inventors: Manabu Sasaki, Osaka; Katsunobu Sayama, Katano; Kunimoto Ninomiya; Shigeo Yata, both of Hirakata; Hiroshi Ishimaru, Tondabayashi, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/791,565

(22) Filed: Feb. 26, 2001

(30) Foreign Application Priority Data

Feb. 25, 2000 (JP) .......................... 2000-049192
Feb. 14, 2001 (JP) .......................... 2001-036824

(51) Int. Cl.$^7$ ..................... H01L 31/042; H01L 31/18
(52) U.S. Cl. ................. 136/244; 136/249; 136/251; 257/443; 257/448; 438/80; 438/66; 438/73
(58) Field of Search ................... 136/244, 249, 136/251; 257/443, 448; 438/80, 66, 73

(56) References Cited

U.S. PATENT DOCUMENTS 4,663,495 A * 5/1987 Berman et al. ............. 136/248
4,936,924 A * 6/1990 Inuzuka ...................... 136/249

* cited by examiner

*Primary Examiner*—Alan Diamond
(74) *Attorney, Agent, or Firm*—Arent, Fox, Kintner, Plotkin & Kahn, PLLC

(57) ABSTRACT

Disclosed is a photovoltaic device comprising on a substrate (1) a plurality of photovoltaic elements (10) each composed of a lamination body of a first electrode (2), a photovoltaic conversion layer (3), and a second electrode (4), the thickness of a side end (B) in the first electrode (2) in the vicinity of a separating trench (S) existing between the first electrode (2) and the adjacent first electrode (2) being larger than the thickness of an element region (A) in the first electrode (2).

27 Claims, 12 Drawing Sheets

PHOTOVOLTAIC DEVICE AND METHOD OF FABRICATING THE SAME

BACKGROUND OF THE INVENTION

1. Field of the Invention

The present invention particularly provides, in a photovoltaic device comprising a first electrode composed of zinc oxide, a photovoltaic device whose characteristics are improved, and a method of fabricating the same.

2. Description of Prior Art

Photovoltaic devices composed of an amorphous semiconductor such as amorphous silicon, amorphous silicon carbide, or amorphous silicon germanium are low in fabrication cost and can be easily increased in area. Accordingly, the photovoltaic devices have been developed as low-cost solar cells.

Referring to a cross-sectional view of FIG. 18, description is made of a photovoltaic element composed of an amorphous semiconductor. A photovoltaic element 10 composed of an amorphous semiconductor comprises a first electrode 2, a photovoltaic conversion layer 3 composed of a lamination body of p-type, i-type, and n-type amorphous semiconductor layers $3p$, $3i$, and $3n$, and a second electrode 4 laminated in this order on a substrate 1. When a translucent member such as glass or plastic is used as the substrate 1, the first electrode 2 is composed of a translucent conductive material, and the second electrode 4 is composed of a highly reflective conductive material.

As the translucent conductive material composing the first electrode 2, tin oxide ($SnO_2$) has been conventionally used. However, it has been examined whether or not zinc oxide (ZnO) is used in order to achieve low cost in recent years, so that a photovoltaic element having high photovoltaic conversion characteristics has been obtained.

For example, a first electrode 2 composed of ZnO is formed by sputtering on a substrate 1 composed of glass, a photovoltaic conversion layer 3 composed of a lamination body of a p-type layer $3p$ having a thickness of approximately 150 Å composed of p-type amorphous silicon carbide, an i-type layer $3i$ having a thickness of approximately 4000 Å composed of i-type amorphous silicon, and an n-type layer $3n$ having a thickness of approximately 200 Å composed of n-type amorphous silicon is then formed by plasma CVD (Chemical Vapor Deposition), and a second electrode 4 composed of Ag is laminated using sputtering, thereby fabricating a photovoltaic element 10.

As a result of changing the thickness of the first electrode 2 to various thicknesses to measure photovoltaic conversion efficiency, high photovoltaic conversion efficiency in excess of 10.5% is obtained in a case where the thickness of the first electrode 2 composed of ZnO is in the range of approximately 2100 Å to approximately 5000 Å, as shown in a characteristic view of FIG. 19.

SUMMARY OF THE INVENTION

In a photovoltaic element using ZnO for a first electrode, however, high photovoltaic conversion efficiency is obtained, as described above. In the case of an integrated photovoltaic device, sufficient characteristics are not obtained.

The present invention has been made in order to solve such a conventional problem, and its object is to provide a photovoltaic device capable of obtaining superior photovoltaic conversion characteristics when ZnO is used for a first electrode and a method of fabricating the same.

A photovoltaic device according to the present invention is characterized by comprising a substrate; a plurality of first electrodes separated from one another by separating trenches on the substrate; a photovoltaic conversion layer provided on the substrate, including the first electrodes; and a plurality of second electrodes provided on the photovoltaic conversion layer and separated from one another by second separating trenches, and in that the thickness of a side end in the first electrode in the vicinity of the separating trench existing between the first electrode and the adjacent first electrode is larger than the thickness of an element region in the first electrode.

According to such construction, a portion irradiated with laser beams for forming the separating trench is formed to a thickness larger than the thickness of the element region. As a result, the first electrodes can be formed in a separated manner with a high yield, thereby making it possible to provide a photovoltaic device having high photovoltaic conversion characteristics.

The photovoltaic device is characterized in that the first electrode is composed of zinc oxide, is characterized in that the thickness of the side end in the first electrode is not less than 5000 Å, and is characterized in that the thickness of the element region in the first electrode is in the range of approximately 2100 Å to approximately 5000 Å.

Furthermore, the photovoltaic device is characterized in that a textured surface is formed in the element region in the first electrode, and is characterized in that the element region in the first electrode is made thinner than the side end in the step of forming the textured surface.

Alternatively, the photovoltaic device is characterized in that the thickness of the side end in the first electrode is larger than the thickness of the element region by forming a laser beam absorbing member.

As described in the foregoing, the thickness of the side end in the vicinity of the separating trench in the first electrode is made larger than the thickness of the element region by providing the laser beam absorbing member on the first electrode. As a result, the first electrodes can be formed in a separated manner with a high yield, thereby making it possible to provide a photovoltaic device having high photovoltaic conversion characteristics.

In addition thereto, the photovoltaic device is characterized in that the first electrode is divided into a plurality of parts by laser beam irradiation.

The present invention is directed to a photovoltaic device, characterized by comprising a substrate; an insulation thin film provided in a portion corresponding to an element region on the substrate; a plurality of first electrodes formed on the substrate, including the insulation thin film, and separated from one another by separating trenches; a photovoltaic conversion layer provided on the substrate, including the first electrodes; and a plurality of second electrodes provided on the photovoltaic conversion layer and separated from one another by second separating trenches, and in that the thickness of a side end in the first electrode in the vicinity of the separating trench existing between the first electrode and the adjacent first electrode is larger than the thickness of the element region in the first electrode.

According to such construction, the portion irradiated with the laser beams for forming the separating trench is formed to a thickness larger than the thickness of the element region. Further, it has a good film orientation. As a result, the first electrodes can be formed in a separated manner with a high yield, thereby making it possible to provide a photovoltaic device having high photovoltaic conversion characteristics.

The photovoltaic device is characterized in that the first electrode is composed of zinc oxide, and is characterized in that the insulation thin film is selected from silicon dioxide ($SiO_2$), aluminum oxide ($Al_2O_3$), and titanium oxide ($TiO_2$).

The photovoltaic device is characterized in that the element region in the first electrode is made thinner than the side end in the step of forming the textured surface.

A method of fabricating a photovoltaic device according to the present invention is a method of fabricating a photovoltaic device comprising on a substrate a plurality of photovoltaic elements each composed of a lamination body of a first electrode, a photovoltaic conversion layer, and a second electrode, characterized by comprising the steps of forming an electrode film on the substrate; thinning a region serving as an element region in the electrode film; irradiating laser beams into a separating region in the electrode film, and removing the electrode film in a portion irradiated with the laser beams, to form a plurality of first electrodes in a separated manner.

According to the above-mentioned construction, the portion irradiated with the laser beams for forming the separating trench is formed to a thickness larger than that of the element region. As a result, the first electrodes can be formed in a separated manner with a high yield, thereby making it possible to provide a photovoltaic device having high photovoltaic conversion characteristics.

The method is characterized in that the electrode film is composed of zinc oxide, is characterized in that the electrode film is formed to a thickness of not less than 5000 Å, and is characterized in that in the step of thinning the region serving as the element region in the electrode film, the thickness of the region serving as the element region is in the range of approximately 2100 Å to approximately 5000 Å.

Furthermore, the method is characterized in that in the step of thinning the region serving as the element region in the electrode film, a textured surface is formed on a surface of the region serving as the element region, and is characterized in that the step of thinning the region serving as the element region in the electrode film is carried out after the step of forming the plurality of first electrodes in a separated manner.

Alternatively, the present invention is directed to a method of fabricating a photovoltaic device comprising on a substrate a plurality of photovoltaic elements each composed of a lamination body of a first electrode, a photovoltaic conversion layer, and a second electrode, characterized by comprising the steps of forming an electrode film on the substrate; providing a laser beam absorbing member on a separating region in the electrode film; and irradiating laser beams into the laser beam absorbing member, removing the laser beam absorbing member in a portion irradiated with the laser beams, together with the electrode film just below the laser beam absorbing member, to form a plurality of first electrodes in a separated manner. According to the above-mentioned construction, the thickness of the side end in the vicinity of the separating trench in the first electrode can be made larger than the thickness of the element region by providing the laser beam absorbing member on the first electrode. As a result, the first electrodes can be formed in a separated manner with a high yield, thereby making it possible to provide a photovoltaic device having high photovoltaic conversion characteristics.

Furthermore, the method is characterized in that the electrode film is formed of zinc oxide, and is formed to a thickness of approximately 2100 Å to approximately 5000 Å.

A method of fabricating a photovoltaic device according to the present invention is a method of fabricating a photovoltaic device comprising on a substrate a plurality of photovoltaic elements each composed of a lamination body of a first electrode, a photovoltaic conversion layer, and a second electrode, characterized by comprising the steps of forming an insulation thin film in a region corresponding to an element region on the substrate; forming an electrode film on the substrate, including the insulation thin film; etching the electrode film, to make the electrode film serving as an element region positioned on the insulation thin film thinner than the electrode film positioned in the other region; and irradiating laser beams into a separating region in the electrode film, and removing the electrode film in a portion irradiated with the laser beams, to form a plurality of first electrodes in a separated manner.

As described in the foregoing, when the insulation thin film is selectively provided on the substrate, the crystallizability of the first electrode which is directly formed on the substrate is higher than that of the first electrode which is formed on the insulation thin film. When etching using a solution of hydrochloric acid (HC1) or a solution of acetic acid ($CH_3COOH$) is performed, therefore, the first electrode in the element region is etched faster than the first electrode at the side end. As a result, the thickness of the side end is made larger than the thickness of the element region. The portion irradiated with the laser beams for forming the separating trench is formed to a thickness larger than that of the element region. Further, it has a good film orientation. As a result, the first electrodes can be formed in a separated manner with a high yield, thereby making it possible to provide a photovoltaic device having high photovoltaic conversion characteristics.

The method is characterized in that the electrode film is formed of zinc oxide, and is characterized in that the insulation thin film is selected from silicon dioxide ($SiO_2$), aluminum oxide ($Al_2O_3$), and titanium oxide ($TiO_2$).

The method is characterized in that in the step of thinning the region serving as the element region in the electrode film, the thickness of the region serving as the element region is in the range of approximately 3500 Å to approximately 5500 Å, and a textured surface is formed on a surface of the electrode film.

The foregoing and other objects, features, aspects and advantages of the present invention will become more apparent from the following detailed description of the present invention when taken in conjunction with the accompanying drawings.

DESCRIPTION OF PREFERRED EMBODIMENTS

The premise of the present invention will be first described.

The inventors and others of the present invention have first examined the reason why characteristics are degraded in the case of an integrated photovoltaic device irrespective of the fact that high photovoltaic conversion efficiency is obtained in a photovoltaic element of one cell using a first electrode composed of ZnO, as described above.

Figure 18:
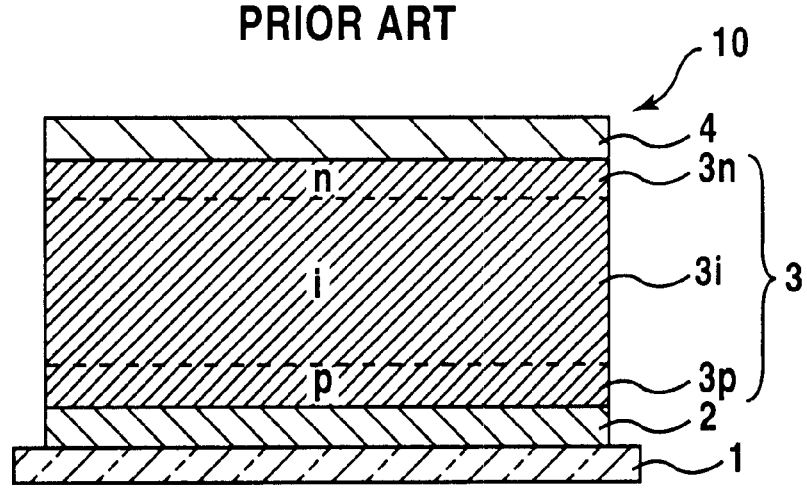
FIG. 18 is a cross-sectional view of the element structure of a photovoltaic element.
Figure 19:
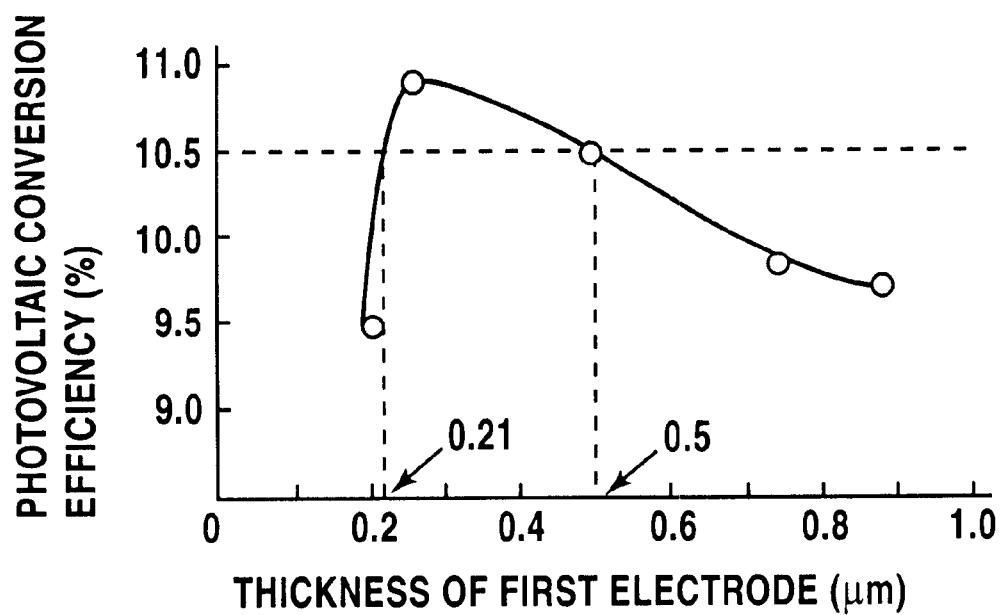
FIG. 19 is a characteristic view showing, in a photovoltaic element using ZnO for a first electrode, the relationship between the thickness of the first electrode and photovoltaic conversion efficiency.
Figure 20:
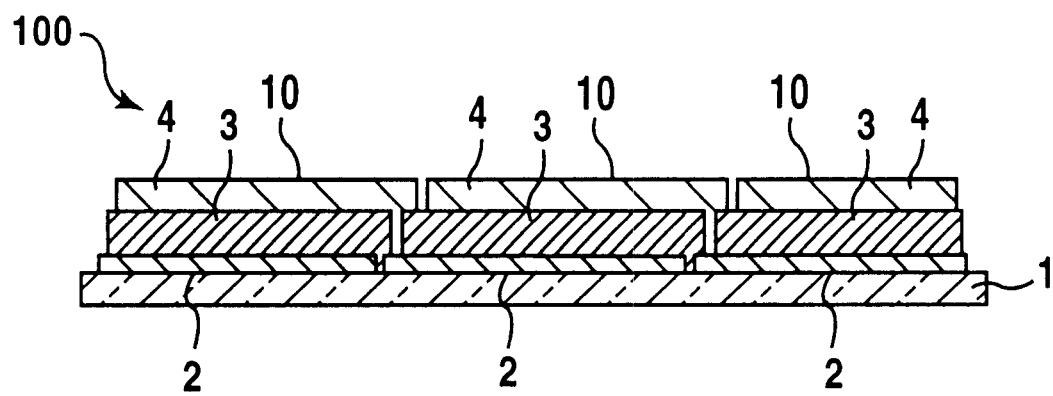
FIG. 20 is a cross-sectional view of a conventional photovoltaic device.

Description is made of the construction of the integrated photovoltaic device with reference to a cross-sectional view of FIG. 20. In FIG. 20, portions having the same functions as those shown in FIG. 18 are assigned the same reference numerals.

Referring to FIG. 20, a photovoltaic device 100 has a structure in which a plurality of photovoltaic elements 10 are arranged side by side on a substrate 1, and a first electrode 2 in one of the adjacent photovoltaic elements 10 and a second electrode 4 in the other photovoltaic element 10 are electrically connected to each other. According to such an integrated structure, the plurality of photovoltaic elements 10 are electrically connected in series or in parallel, thereby making it possible to take out an arbitrary output voltage by one substrate.

The photovoltaic device 100 having such a structure is generally fabricated using laser patterning. For example, a translucent conductive film is formed on an approximately entire surface of the substrate 1, and is divided into a plurality of first electrodes 2 by laser patterning.

P-type, i-type, and n-type amorphous semiconductor layers are laminated in this order on the approximately entire surface of the substrate 1, including the plurality of first electrodes 2, and the amorphous semiconductor layer is then divided using laser patterning, to form a plurality of photovoltaic conversion layers 3. Finally, a highly reflective conductive film is formed on an approximately entire surface of the substrate 1, including the plurality of photovoltaic conversion layers 3, and is divided into a plurality of second electrodes 4 by laser patterning. By the foregoing steps, a photovoltaic device having the structure shown in FIG. 20 is fabricated. Generally used as laser beams used for such laser patterning are YAG lasers having a wavelength of 1.06 µm.

As described in the foregoing, in the photovoltaic element using the first electrode composed of ZnO, high photovoltaic conversion efficiency in excess of 10.5% can be obtained by setting the thickness of the first electrode in the range of approximately 2100 Å to approximately 5000 Å. However, the first electrode does not sufficiently absorb the laser beams when it has such a thickness. It is considered that a ZnO film which is a translucent conductive film is not electrically separated completely in forming the plurality of first electrodes in a separated manner by laser patterning.

Figure 21:
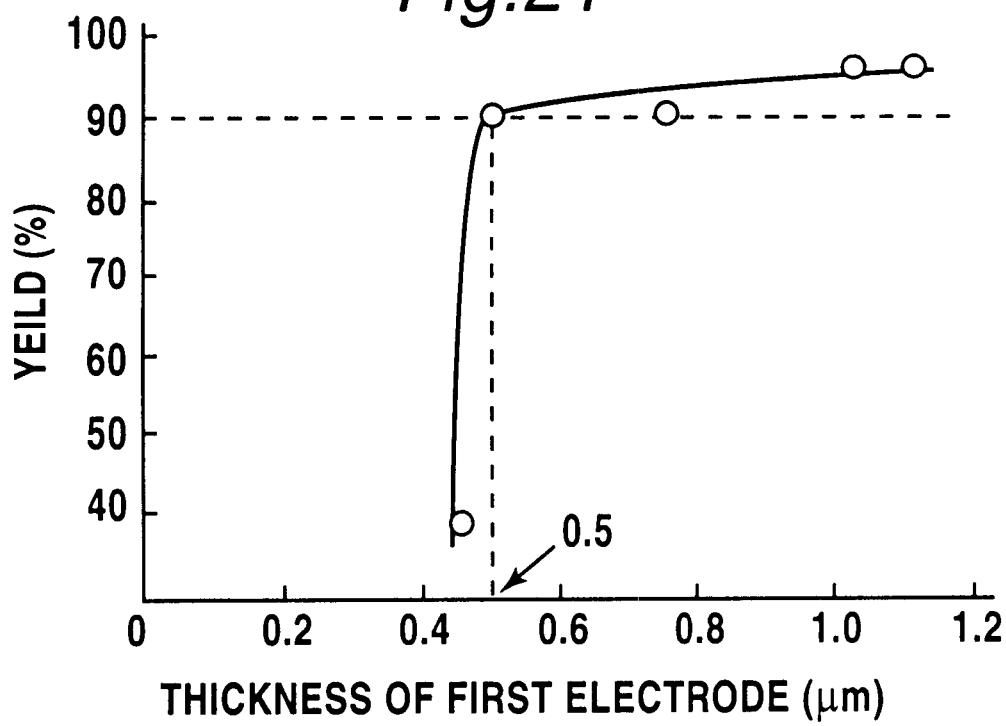
FIG. 21 is a characteristic view showing, in a photovoltaic element using ZnO for a first electrode, the relationship between the thickness of the first electrode and the yield.

Therefore, the inventors and others have formed ZnO films having various thicknesses on a glass substrate, have divided each of the ZnO films into two electrodes by laser patterning, and have measured resistance between both the electrodes, to examine the relationship between the yield in a case where the ZnO film in which the resistance between the electrodes is not less than 10 MΩ is taken as an acceptable product and the thickness of the ZnO film. The results of the examination are shown in a characteristic view of FIG. 21. The separating width between the two electrodes is set to approximately 100 µm which is approximately the same as that in a case where the ZnO film is used for the integrated photovoltaic device. As apparent from the result, a good yield of not less than 90% is obtained when the thickness of the ZnO film is not less than 5000 Å. However, the yield is lowered when the thickness of the ZnO film is decreased, and only a low yield of not more than 40% is obtained when it is not more than 4500 Å.

Furthermore, the inventors and others of the present invention have changed, in the integrated photovoltaic device, the thickness of the ZnO film on the glass substrate in the range of 3000 Å to 12000 Å, have divided the ZnO film into a plurality of electrodes by laser patterning, and have formed the photovoltaic conversion layers 3 and the second electrodes 4 on the plurality of electrodes by the above-mentioned method, to fabricate the integrated photovoltaic device having the structure shown in FIG. 20.

At this time, the laser power density at the time of laser patterning of the ZnO film has been also changed. Results of measurement of the average of low-illuminance voltages in the integrated photovoltaic device fabricated under a plurality of conditions are shown in FIG. 5 and in the following Table 1.

TABLE 1

| | average low-illuminance voltage (V) | | |
|---|---|---|---|
| thickness of ZnO (Å) | laser power density $4 \times 10^7$ W/cm$^2$ | laser power density $3.2 \times 10^7$ W/cm$^2$ | laser power density $2.4 \times 10^7$ W/cm$^2$ |
| 12000 | 1.2 | 1.2 | 1.2 |
| 11000 | 1.2 | 1.2 | 1.2 |
| 10000 | 1.2 | 1.2 | 1.2 |
| 9000 | 1.2 | 1.2 | 1.2 |
| 8000 | 1.2 | 1.2 | 1.2 |
| 7000 | 0.9 | 1.2 | 1.2 |
| 6000 | 0.8 | 1.2 | 1.2 |
| 5000 | 0.1 | 0.3 | 1.2 |
| 4000 | 0.05 | 0.05 | 1.2 |
| 3000 | 0.05 | 0.05 | 0.8 |

Figure 5:
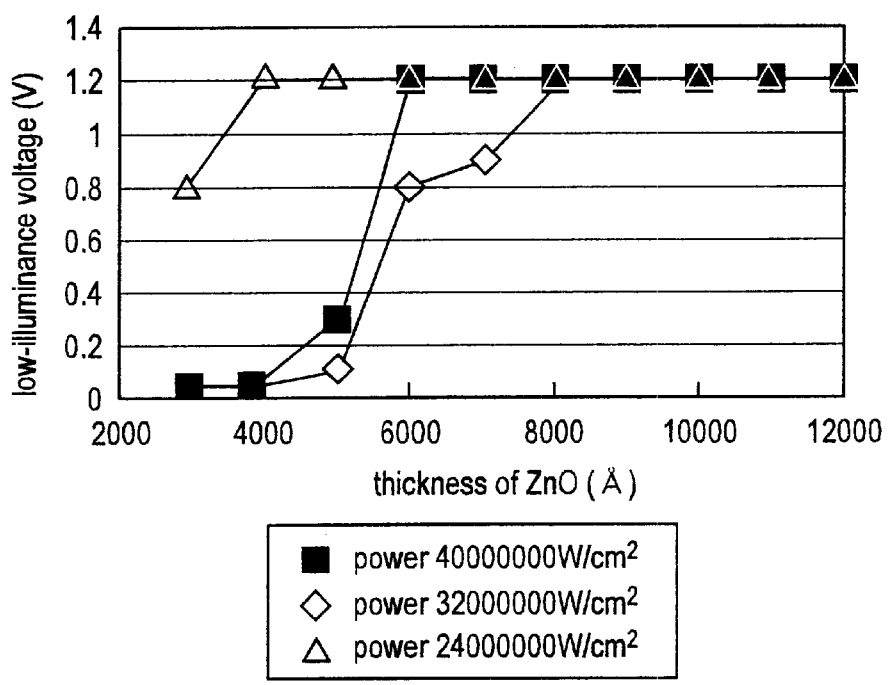
FIG. 5 is a characteristic view showing, in an integrated photovoltaic device using ZnO for a first electrode, the relationship between the thickness of the first electrode and a low-illuminance voltage.

From Table 1 and FIG. 5, it is considered that it is effective in improving the yield to increase the thickness of the ZnO film in a laser processing portion and decrease the laser power density.

From the results of the foregoing preliminary experiments, in the photovoltaic element using the first electrode composed of ZnO, high photovoltaic conversion efficiency in excess of 10.5% is obtained by setting the thickness of the first electrode in the range of approximately 2100 Å to approximately 5000 Å, while electrical separation is not sufficiently made in the case of laser patterning when the first electrode has such a thickness. Therefore, it is presumed that when the integrated photovoltaic device is fabricated, the characteristics thereof are degraded.

The present invention provides a photovoltaic device capable of obtaining superior photovoltaic conversion characteristics in a case where ZnO is used for a first electrode and a method of fabricating the same on the basis of such consideration.

Embodiments of the present invention will be described with reference to the drawings.

Figure 1:
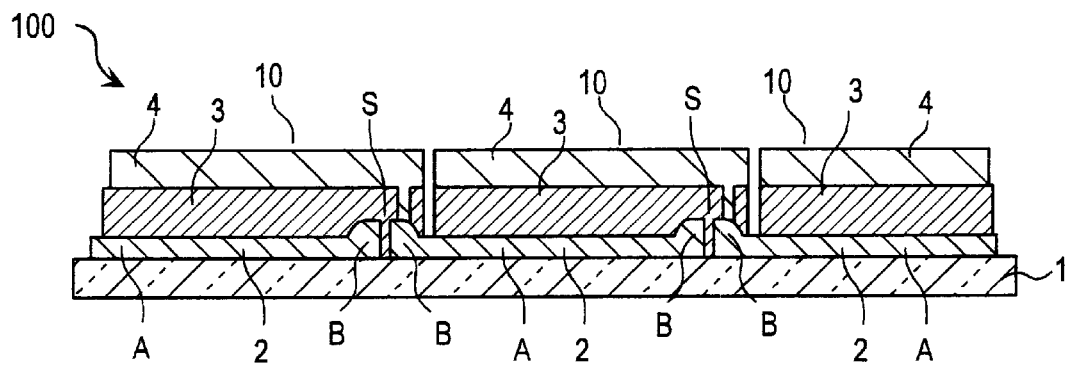
FIG. 1 is a cross-sectional view of a photovoltaic device according to a first embodiment of the present invention.

FIG. 1 is a cross-sectional view for explaining a photovoltaic device according to an embodiment of the present invention. FIG. 2 is a cross-sectional view by steps for explaining a method of fabricating the photovoltaic device shown in FIG. 1. In FIGS. 1 and 2, portions having the same functions as those shown in FIG. 20 are assigned the same reference numerals.

As shown in FIG. 1, adjacent first electrodes 2 are separated from each other by a separating trench S. In a photovoltaic device 100 according to the present embodiment, the thickness of a side end B positioned in the vicinity of the separating trench S in the first electrode 2 is made larger than the thickness of an element region A. That is, according to such construction, a portion irradiated with laser beams for forming the separating trench S is formed to a thickness larger than that of the element region A. As a result, the first electrodes 2 can be formed in a separated manner with a high yield, thereby making it possible to provide a photovoltaic device having high photovoltaic conversion characteristics.

In a case where the first electrode 2 is composed of ZnO, for example, if the thickness of the side end B is not less than 5000 Å, the first electrodes 2 can be formed in a separated manner with a high yield by irradiating laser beams. In addition, the thickness of the element region A is set in the range of approximately 2100 Å to approximately 5000 Å, thereby making it possible to obtain high photovoltaic conversion characteristics. According to the present invention, it is possible to provide a photovoltaic device having high photovoltaic conversion characteristics with a high yield.

Referring to FIG. 2, a method of fabricating the photovoltaic device according to the present embodiment will be described. In the first step shown in FIG. 2A, a translucent conductive film 21 composed of zinc oxide (ZnO) is first formed on an approximately entire surface of a substrate 1 composed of a material having a translucent and insulating surface, for example, glass or plastic.

Figure 2A:
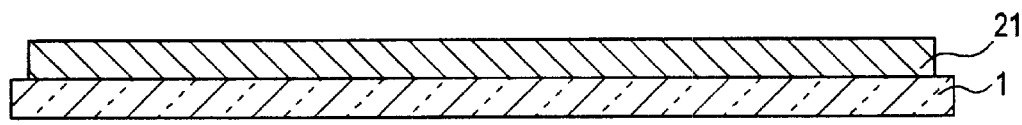
FIG. 2 is a cross-sectional view by steps for explaining a method of fabricating the photovoltaic device according to the first embodiment of the present invention.
Figure 2B:
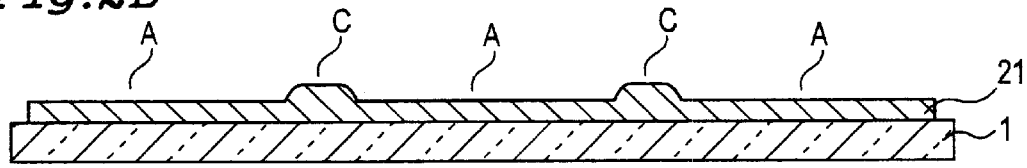

In the second step shown in FIG. 2B, a portion serving as an element region A of the conductive film 21 is then thinned. The thinning can be performed by subjecting the conductive film 21 to etching such as wet etching or dry etching in a state where a removal region C including a portion to be removed in the conductive film 21 by laser beam irradiation is masked by a resist film, for example, in the third step, described below.

Figure 2C:
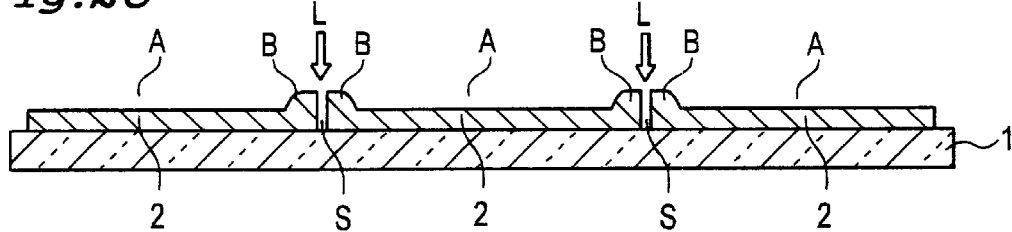

In the third step shown in FIG. 2C, laser beams L are then irradiated into the removal region C having a large thickness. The conductive film 21 in a portion irradiated with the laser beams L is removed to form a separating trench S and form a plurality of first electrodes 2 in a separated manner. In the laser patterning, Nd: YAG lasers having a wavelength of 1.06 µm and having a pulse frequency of 3 kHz are used as the laser beams L, and are irradiated into the removal region C in the conductive film 21 at a laser power density of $4 \times 10^7$ W/cm$^2$ and at a processing rate of 10 mm/sec. from the side of the substrate 1. The laser power density is such intensity that the glass substrate is not affected by heat.

Figure 2D:
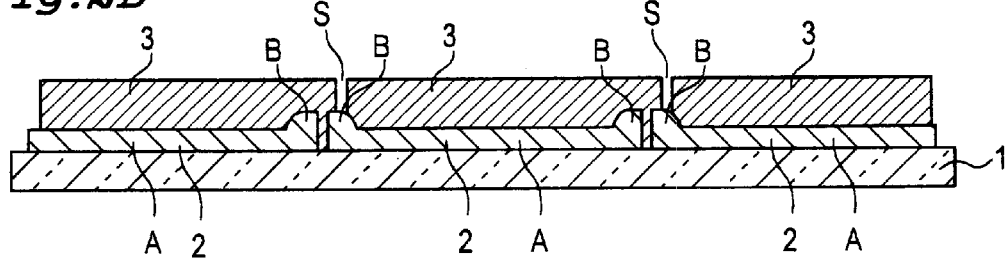

Furthermore, in the fourth step shown in FIG. 2D, p-type, i-type, and n-type amorphous semiconductor lasers are formed in this order on the substrate 1, including the plurality of first electrodes 2, by plasma CVD. Then a plurality of photovoltaic conversion layers 3 are formed in a separated manner by laser patterning. Each of the photovoltaic conversion layers 3 is formed using a known parallel plate-type plasma CVD device. The discharge electrode area is 1500 cm$^2$, and the spacing between the electrodes is 40 mm. Further, the laser patterning is performed at a laser power density of $2 \times 10^7$ W/cm$^2$ and at a processing rate of 10 mm/sec. using YAG laser secondary harmonics having a wavelength of 0.53 µm and having a pulse frequency of 3 kHz.

Finally, a metal film such as an Ag film or an Al film is formed on the substrate 1, including the photovoltaic conversion layers 3, by sputtering, and a plurality of second electrodes 4 are then formed in a separated manner by laser patterning, to fabricate the photovoltaic device shown in FIG. 1.

In the present invention, the Al film is formed to a thickness of 4000 Å as a metal film by DC magnetron sputtering. As forming conditions, the substrate temperature is 200° C., Ar gas is caused to flow at a flow rate of 400 sccm, and a power of 0.1 kW is applied to an Al target having an area of 300 cm² under a 1Pa atmosphere. Further, the laser patterning is performed at a laser power density of $2 \times 10^7$ W/cm² and at a processing rate of 10 mm/sec. using YAG laser secondary harmonics having a wavelength of 0.53 μm and having a pulse frequency of 3 kHz.

In such a fabricating method, when the first electrode 2, for example, is composed of ZnO, the conductive film 21 composed of ZnO is formed to a thickness of not less than 5000 Å in the first step. In the second step, the element region A is then thinned to a thickness in the range of approximately 2100 Å to approximately 5000 Å.

According to such a method, the removal region C composed of ZnO having a thickness of not less than 5000 Å is irradiated with the laser beams in the third step. Accordingly, the first electrodes 2 can be formed in a separated manner with a high yield. Further, the thickness of the element region A is in the range of approximately 2100 Å to approximately 5000 Å, thereby making it possible to obtain high photovoltaic conversion characteristics.

Furthermore, when the thinning in the second step is performed by etching using a solution of hydrochloric acid (HCl) or a solution of acetic acid ($CH_3COOH$), an irregular surface serving as a texture plane can be formed on a surface of the element region A. According to this method, therefore, the irregular surface serving as the texture plane can be formed on the surface of the element region A simultaneously with the thinning of the element region A, thereby making it possible to fabricate a photovoltaic device having superior photovoltaic conversion characteristics in a simple process.

Although in the above-mentioned fabricating method, after the element region A is thinned, the laser beams L1 are irradiated into the removal region C, to form the plurality of first electrodes 2 in a separated manner, the element region A may be thinned after the laser beams L1 are previously irradiated into the removal region C to form the plurality of first electrodes 2 in a separated manner.

For example, after the ZnO film 21 is formed to a thickness of not less than 5000 Å on the substrate 1, and the plurality of first electrodes 2 are separated by laser beam irradiation, the element region A may be thinned to a thickness in the range of approximately 2100 Å to approximately 5000 Å. According to such construction, even if the conductive film is not sufficiently removed by laser beam irradiation so that the conductive film remains in the separating trench S, the residual is removed by etching in the subsequent step. Accordingly, electrical separation is made more complete, thereby obtaining a more preferable effect.

(Second Embodiment)

A photovoltaic device according to a second embodiment of the present invention will be described with reference to a structural sectional view of FIG. 3. Portions having the same functions as those in the first embodiment are assigned the same reference numerals and hence, the description thereof is not repeated in order to avoid the overlapping of the description.

In the present embodiment, the thickness of a side end B in the vicinity of a separating trench S in a first electrode 2 is made larger than the thickness of an element region A by providing a laser beam absorbing member 51 on the first electrode 2. Also in such construction, the same effect as that in the above-mentioned first embodiment is produced.

FIG. 4 is a cross-sectional view by steps for explaining a method of fabricating a photovoltaic device according to the present embodiment.

Figure 4A:
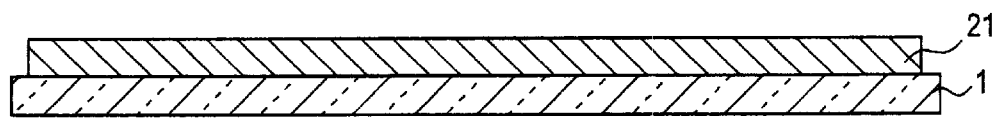
FIG. 4 is a cross-sectional view by steps for explaining a method of fabricating the photovoltaic device according to the second embodiment of the present invention.

In the first step shown in FIG. 4A, a translucent conductive film 21 is first formed on a substrate 1. When the conductive film 21 is formed using ZnO, it is formed to a thickness in the range of approximately 2100 Å to approximately 5000 Å.

Figure 4B:
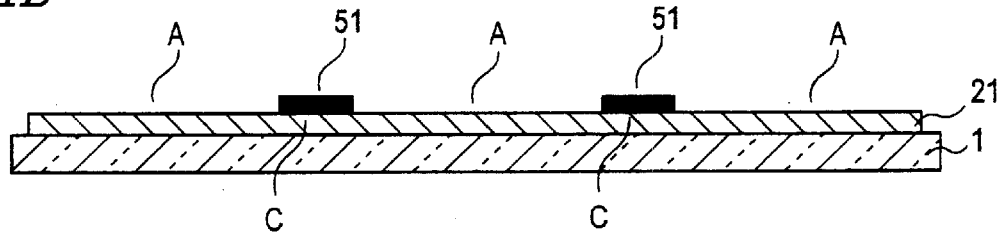

In the second step shown in FIG. 4B, a laser beam absorbing member 51 is then formed on a removal region C of the conductive film 21. The laser beam absorbing member 51 may be composed of a material having conductive properties or a material having insulating properties, provided that the material absorbs laser beams. When YAG lasers having a wavelength of 1.06 μm are used as laser beams, for example, the laser beam absorbing member 51 can be composed of a material with low surface reflection, for example, titanium or carbon. Alternatively, a conductive oxide such as tin oxide ($SnO_2$) or ]TO (Indium Tin Oxide) may be used as the laser beam absorbing member 51.

Figure 4C:
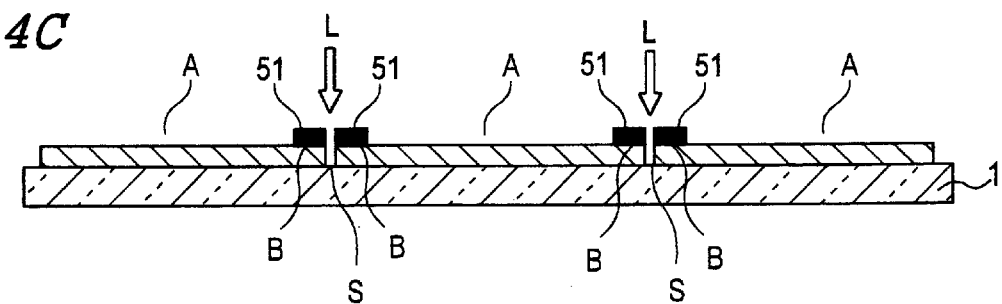

In the third step shown in FIG. 4C, the laser beam absorbing member 51 is then irradiated with laser beams L, and the laser beam absorbing member 51 in a portion irradiated with the laser beams L and the conductive film 21 positioned just below the laser-irradiated portion of the laser beam absorbing member 51 are simultaneously removed, thereby forming a separating trench S as well as forming a plurality of first electrodes 2 in a separated manner.

Figure 3:
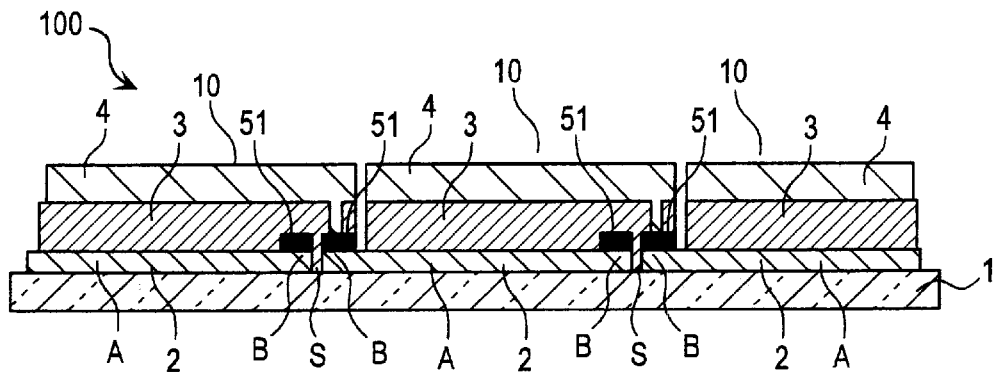
FIG. 3 is a cross-sectional view of a photovoltaic device according to a second embodiment of the present invention.

A plurality of photovoltaic conversion layers 3 and second electrodes 4 are formed, as in the first embodiment, thereby making it possible to fabricate a photovoltaic device having the structure shown in FIG. 3.

Also in the present embodiment, it is possible to provide a photovoltaic device having superior photovoltaic characteristics with a high yield, as in the above-mentioned first embodiment.

(Third Embodiment)

Figure 6:
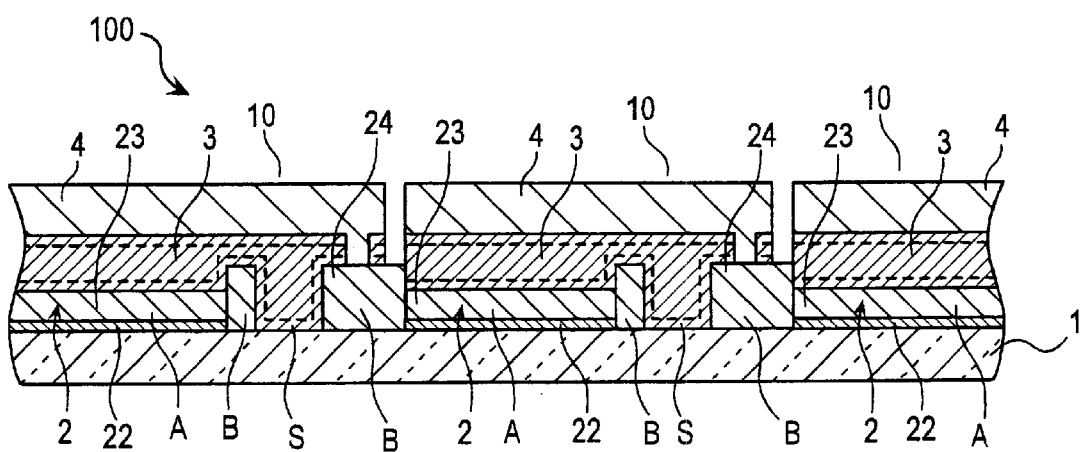
FIG. 6 is a cross-sectional view of a photovoltaic device according to a third embodiment of the present invention.

A photovoltaic device according to a third embodiment of the present invention will be described with reference to FIGS. 6 to 16. FIG. 6 is a structural sectional view showing a photovoltaic device according to a third embodiment of the present invention. Portions having the same functions as those in the first embodiment are assigned the same reference numerals and hence, the description thereof is not repeated in order to avoid the overlapping of the description.

Furthermore, the inventors and others have examined what effect is exerted by the orientation of a ZnO film serving as a first electrode at the time of laser patterning. As the ZnO film to be formed on a glass substrate 1, ZnO films respectively having thicknesses fixed to 5000 Å and having different orientations are formed. The laser processing power is fixed to 80 mW, to measure the average of low-illuminance voltages in an integrated photovoltaic device in a case where a first electrode is divided.

Figure 7:
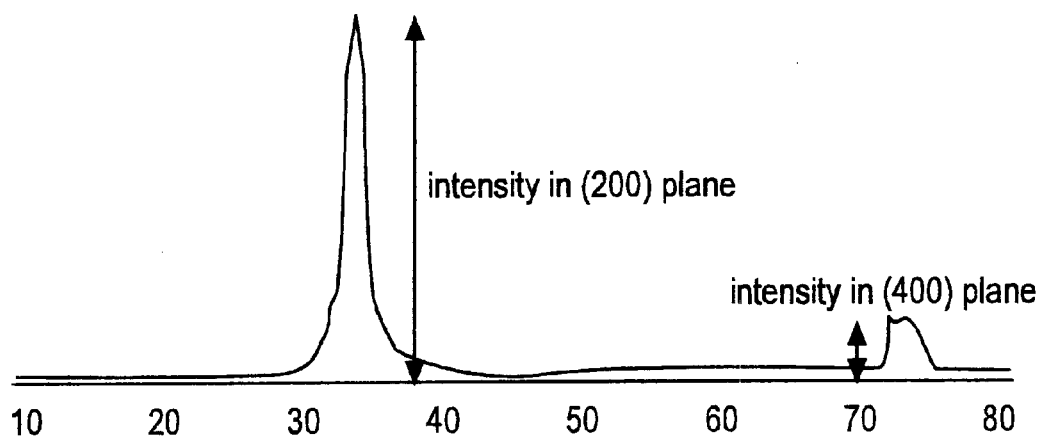
FIG. 7 is a characteristic view showing the X-ray diffraction peak intensity of a ZnO film.

The orientation is measured by examining an X-ray diffraction pattern of the formed ZnO film and changing the X-ray diffraction peak intensity ratio I thereof. That is, the ZnO film has X-ray diffraction peaks, respectively, in a (002) plane and a (004) plane, as shown in FIG. 7. The (002) plane is a plane having good crystallizability. The intensity means the number of electrons (the unit is count) in a case where when the angle of incidence θ of X-rays is continuously changed while rotating a sample in X-ray diffractometry, the position of a detector is rotated while being optically related such that the angle of the diffracted X-rays is 2 θ, to detect the X-rays diffracted and emitted from a surface of the sample.

This indicates that the higher the ratio of the intensity in the (002) plane to the intensity in the (004) plane, that is, the X-ray diffraction peak intensity ratio I {(002)/(004)} is, the better the orientation is. The X-ray diffraction peak intensity ratio is changed depending on conditions such as sputter forming temperature.

Figure 8:
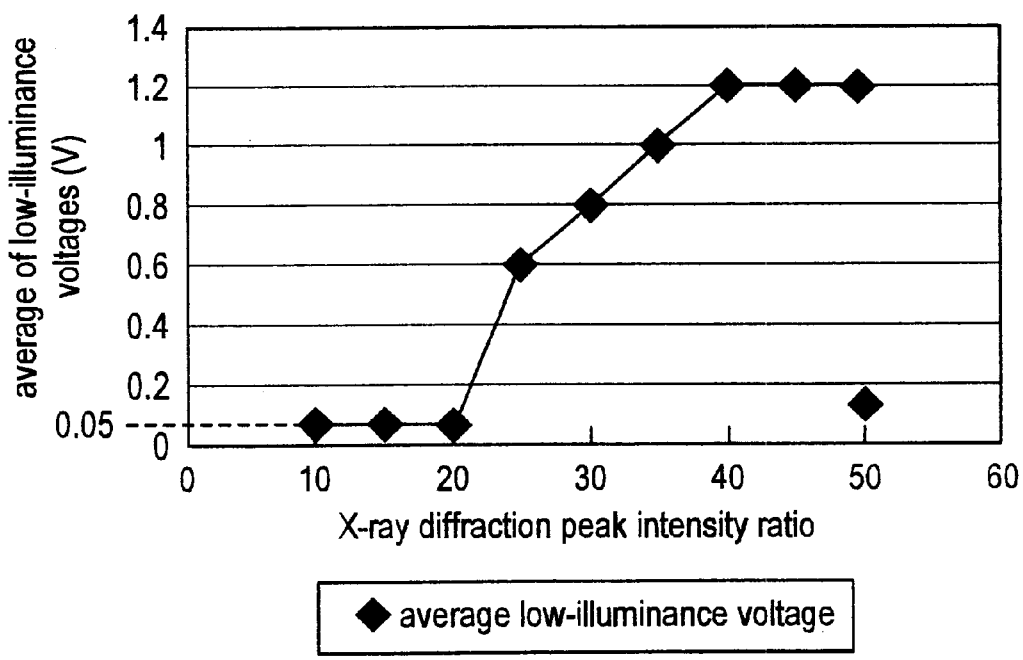
FIG. 8 is a characteristic view showing the relationship between the X-ray diffraction peak intensity ratio of a ZnO film and the average of low-illuminance voltages.

FIG. 8 shows the results of measurement of the average of low-illuminance voltages in the integrated photovoltaic device in a case where the X-ray diffraction peak intensity ratio I is changed to form a ZnO film serving as a first electrode 2, and the ZnO film is divided at a laser processing power of 80 mW. The thickness of the ZnO film is fixed to 6000 Å.

As can be seen from FIG. 8, when the X-ray diffraction peak intensity ratio I is not less than 40, good values are obtained in all stages of the integrated photovoltaic device, and the laser processing yield is improved.

Furthermore, it is known that the ZnO film having a high orientation has a low etching rate. In the third embodiment, therefore, the ZnO film having a high orientation is formed only in a processing region to be subjected to laser patterning, and the thickness of the ZnO film is changed by etching. That is, the thickness of the region to be subjected to laser patterning is made larger than the thickness of an element region A, thereby improving the laser processing yield.

According to such construction, a portion irradiated with laser beams for forming a separating trench S is formed to a thickness larger than that of the element region A. Further, it has a good film orientation. As a result, first electrodes can be formed in a separated manner with a high yield, thereby making it possible to provide a photovoltaic device having high photovoltaic conversion characteristics.

As shown in FIG. 6, the adjacent first electrodes 2 are separated by the separating trench S. In the photovoltaic device 100 according to the third embodiment, an insulation thin film 22 is formed in the element region A. Used as the insulation thin film 21 is silicon dioxide ($SiO_2$), aluminum oxide ($Al_2O_3$), or titanium oxide ($TiO_2$). Further, no insulation thin film is provided at a side end B positioned in the vicinity of the separating trench S, that is, in a portion corresponding to a laser processing portion.

After the insulation thin film 22 is selectively provided on the substrate 1, the ZnO film serving as the first electrode 2 is thus formed by sputtering. The crystallizability of the ZnO film formed by sputtering, which is directly formed on the glass substrate 1, is higher than that of the ZnO film which is formed on the insulation thin film 22.

When etching using a solution of hydrochloric acid (HCl) or a solution of acetic acid ($CH_3COOH$) is made, therefore, a ZnO film 23 in the element region A is etched faster than a ZnO film 24 at the side end B. As a result, the thickness of the side end B is made larger than the thickness of the element region A. Further, irregular surfaces serving as texture planes are formed on respective surfaces of the ZnO films.

As described in the foregoing, the thickness of the ZnO film 24 at the side end B is made larger than the thickness of the ZnO film 23 in the element region A by the etching, so that the thickness of the ZnO film in only the laser processing portion can be increased. That is, according to such construction, the portion irradiated with laser beams for forming the separating trench S is formed to a thickness larger than the thickness of the element region A. Accordingly, the first electrodes 2 can be formed in a separated manner with a high yield, thereby making it possible to provide a photovoltaic device having high photovoltaic conversion characteristics.

Figure 9A:
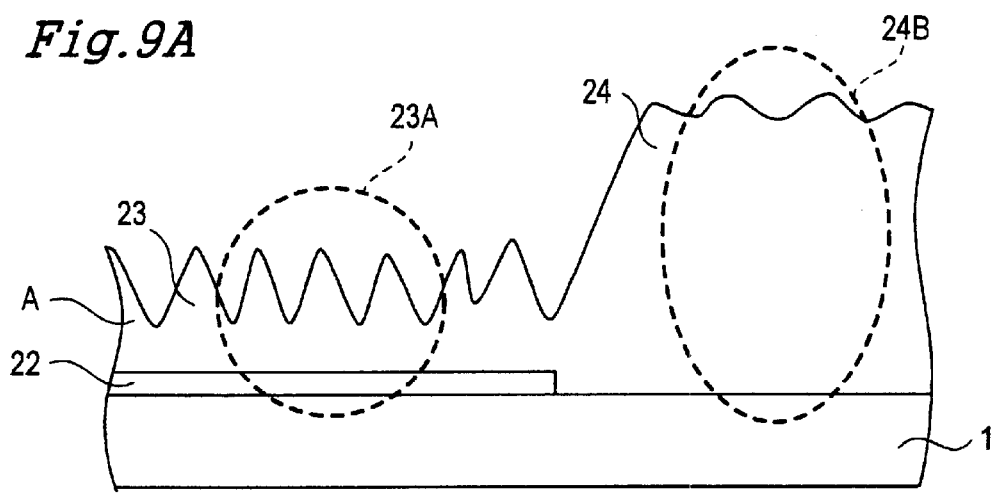
FIG. 9A is a cross-sectional view showing a laser processing region in the photovoltaic device according to the third embodiment of the present invention.
Figure 9B:
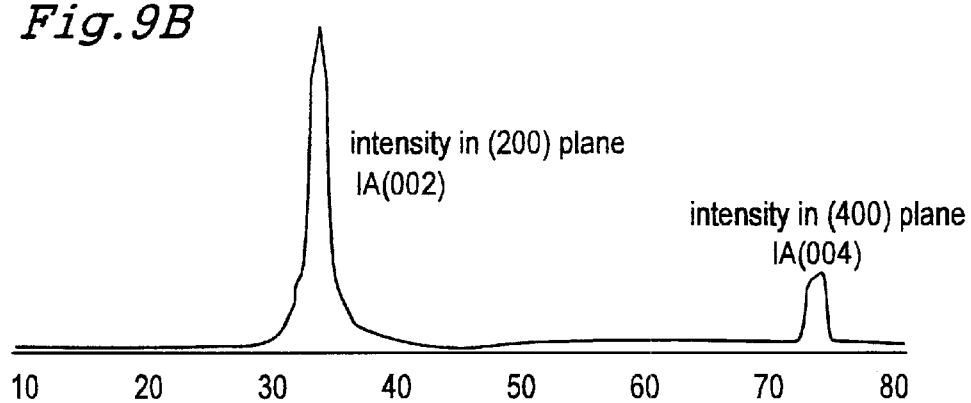
FIG. 9B is a characteristic view showing the X-ray diffraction peak intensity in an element region in the photovoltaic device according to the third embodiment of the present invention.

FIG. 9A is a schematic sectional view showing the vicinity of the laser processing portion (the side end). As shown in FIG. 9A, etching progresses in a part of the ZnO film 23 in the element region A faster, so that the thickness thereof is small. FIG. 9B illustrates the X-ray diffraction pattern intensity of the ZnO film 23 examined in a part of the element region A (a portion denoted by reference numeral 23A in FIG. 9A), and FIG. 9C illustrates the X-ray diffraction pattern intensity of the ZnO film 24 examined in a part of the laser processing portion (the side end) B (a portion denoted by reference numeral 24B in FIG. 9A).

Figure 9C:
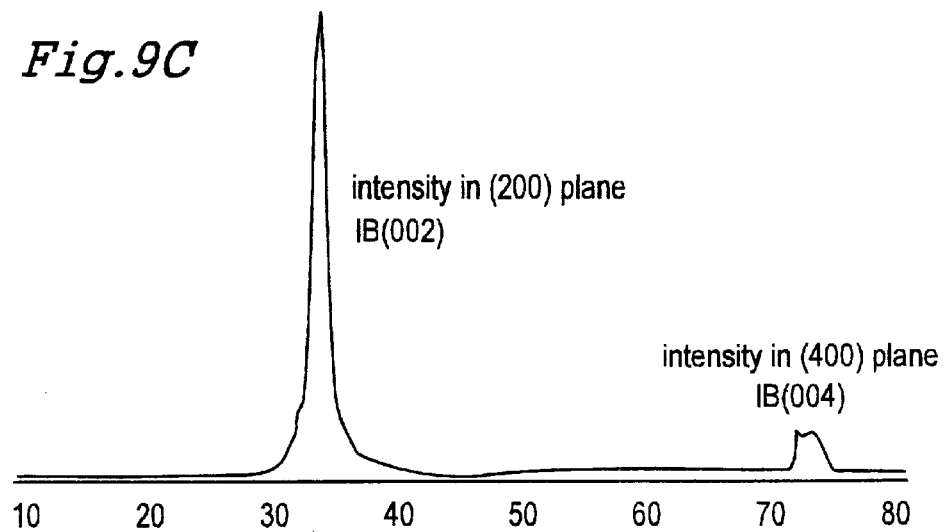
FIG. 9C is a characteristic view showing the X-ray diffraction peak intensity in a laser processing region in the photovoltaic device according to the third embodiment of the present invention.

The ZnO film has X-ray diffraction peaks, respectively, in the (002) plane and the (004) plane, as shown in FIGS. 9B and 9C. As described above, the higher the ratio (002)/(004), that is, the X-ray diffraction peak intensity ratio I is, the better the orientation is. It is found that etching in the element region A is faster than that in the laser processing portion (the side end) B.

Figure 11:
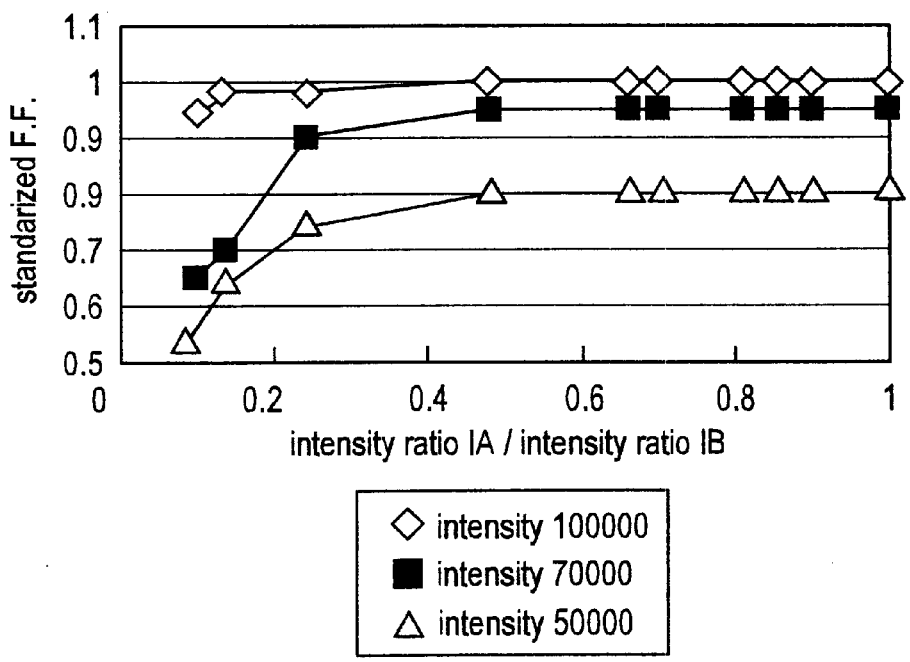
FIG. 11 is a characteristic view showing the relationship between the X-ray diffraction peak intensity ratio of a ZnO film and a standardized file factor.
Figure 12:
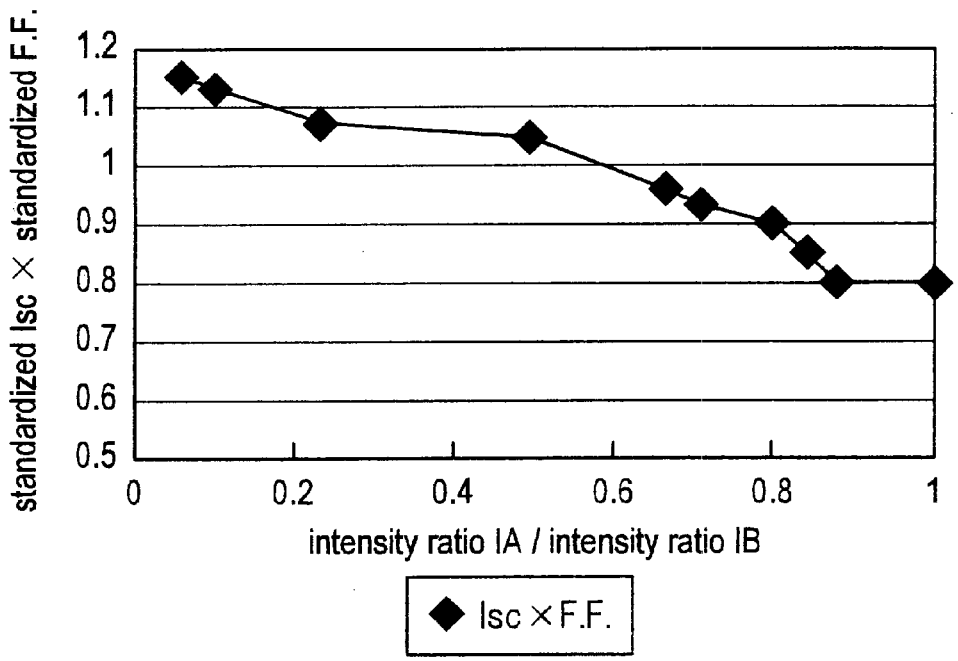
FIG. 12 is a characteristic view showing the relationship between the X-ray diffraction peak intensity ratio of a ZnO film and the product of standardized current and a standardized file factor.

As described in the foregoing, the crystallizability of each of the laser processing portion (the side end) B and the element region A is then changed and at the same time, the laser processing portion B and the element region A are made irregular and thinned by etching. The X-ray diffraction peak intensity ratio I (002)/(004) in each of the laser processing portion B and the element region A is examined. Further, letting IB be the X-ray diffraction peak intensity ratio in the laser processing portion (the side end) B, and IA be the X-ray diffraction peak intensity ratio in the element region A, the relationship between the ratio of IA to IB (IA/IB) and the integrated photovoltaic device is examined. The results are shown in FIGS. 10 to 12.

Figure 10:
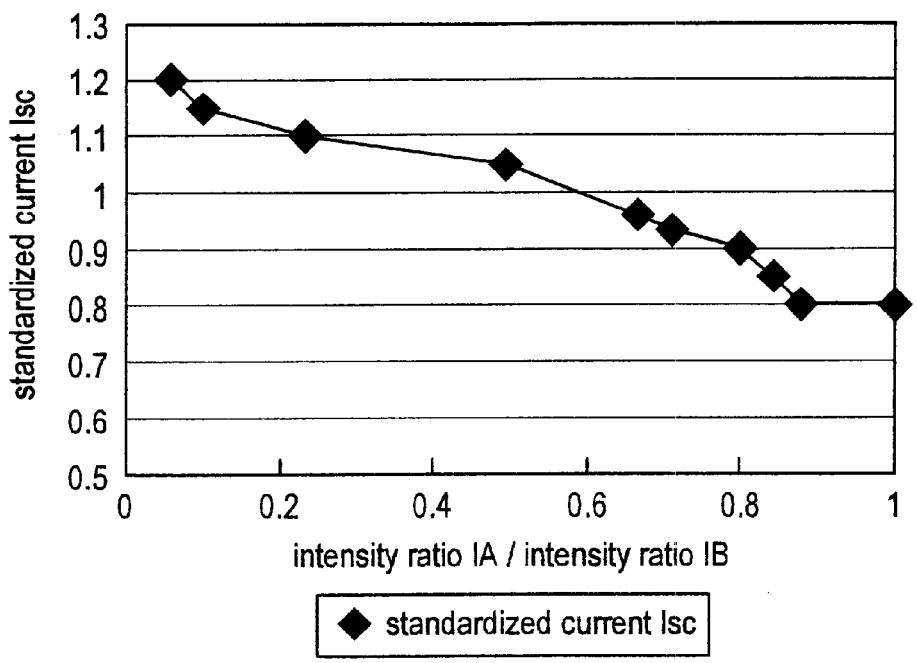
FIG. 10 is a characteristic view showing the relationship between the X-ray diffraction peak intensity ratio of a ZnO film and standardized current.

FIG. 10 shows that current is improved when the intensity ratio IA is lower than the intensity ratio IB, and the current is improved when the intensity ratio IB is not less than twice the intensity ratio IA. FIG. 11 shows that when the intensity ratio IB is low, F.F. (a file factor) is not lowered. Further, FIG. 12 shows that the product of the current and the F.F. is improved when the ratio of the intensity ratio IA to the intensity ratio IB (IA/IB) is not more than 0.5, that is, the intensity ratio in the laser processing portion B is not less than twice the intensity ratio in the element region A.

Figure 13:
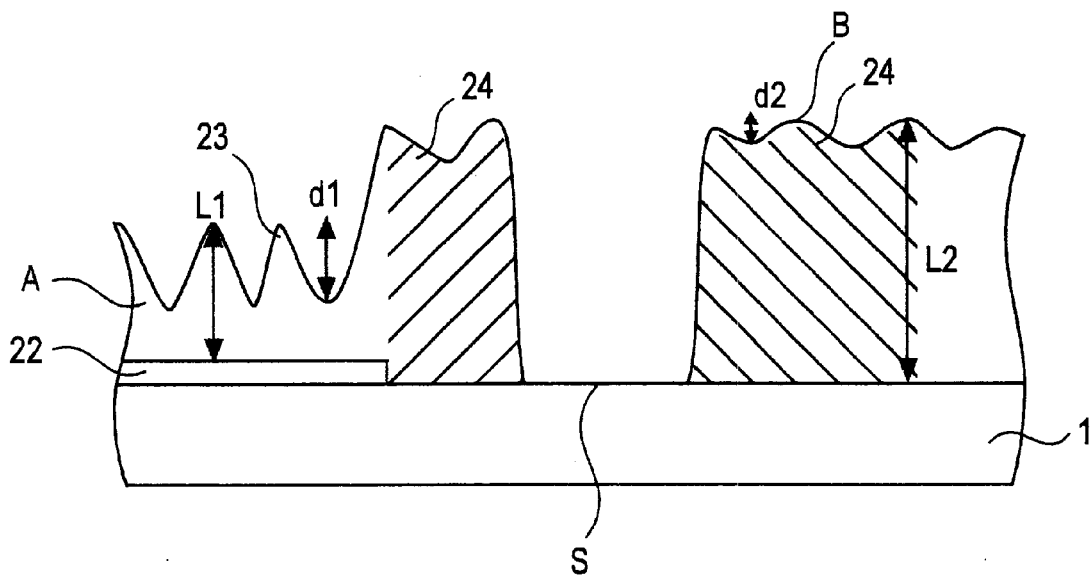
FIG. 13 is a cross-sectional view showing the laser processing region in the photovoltaic device according to the third embodiment of the present invention.
Figure 14:
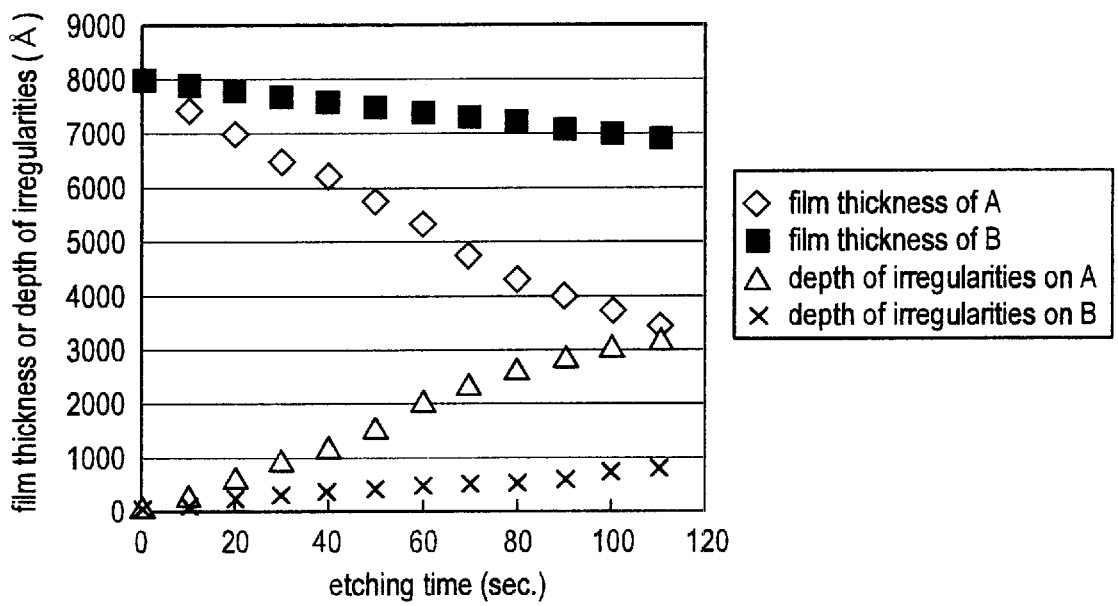
FIG. 14 is a characteristic view showing the relationship between the etching time and the thickness of a ZnO film in the photovoltaic device according to the third embodiment of the present invention.
Figure 15:
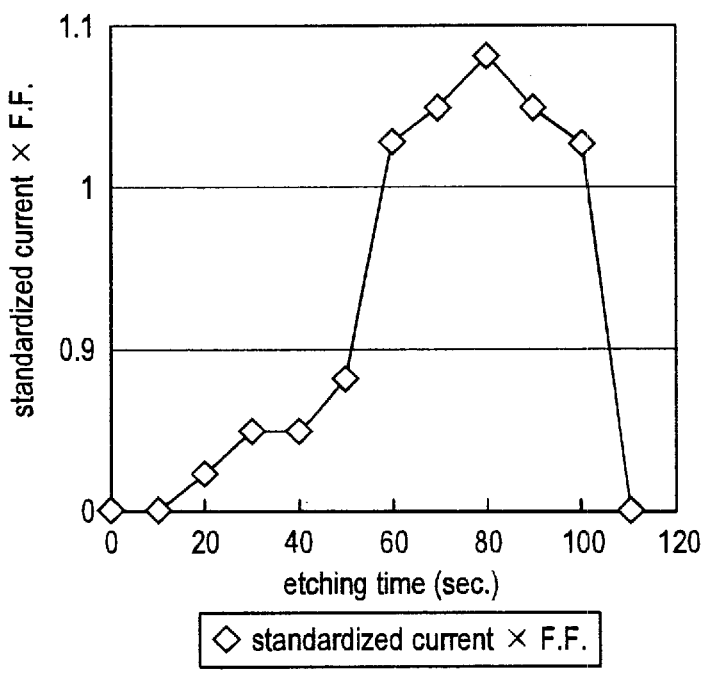
FIG. 15 is a characteristic view showing the relationship between the etching time and the product of standardized current and a standardized file factor in the photovoltaic device according to the third embodiment of the present invention.

As shown in FIG. 13, the relationship between the respective thicknesses L1 and L2 of the films and the respective depths d1 and d2 of irregularities in the laser processing portion (the side end) B and the element region A in a case where the intensity ratio IB is not less than twice the intensity ratio IA and the integrated photovoltaic device. The results are shown in FIGS. 14 and 15. From FIGS. 13 and 14, it is preferable that the depth of the irregularities on the surface of the element region A is not less than 1500 Å nor more than 3200 Å, and the depth of the irregularities on the surface of the laser processing portion (the side end) B is not more than 800 Å. The thickness of the laser processing portion (the side end) B is set to 7000 Å when the thickness of the element region A is in the range of approximately 3500 Å to approximately 5500 Å, thereby making it possible to form the first electrodes in a separated manner with a high yield by laser beam irradiation. In addition, it is possible to provide a photovoltaic device having high photovoltaic conversion characteristics with a high yield.

FIG. 16 is a cross-sectional view by steps for explaining the steps of fabricating the photovoltaic device according to the present embodiment.

In the first step shown in FIG. 16, an insulation thin film 22 (an $SiO_2$ film in the present embodiment) is first provided in only a portion corresponding to an element region A on a substrate 1.

Figure 16A:
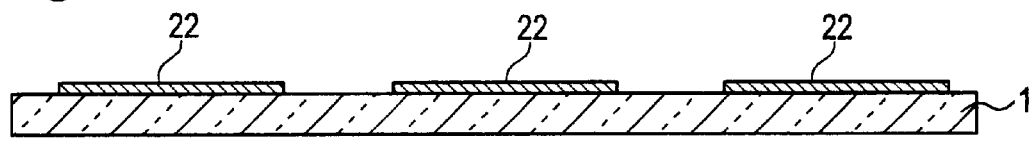
FIG. 16 is a cross-sectional view by steps for explaining a method of fabricating the photovoltaic device according to the third embodiment of the present invention.
Figure 16B:
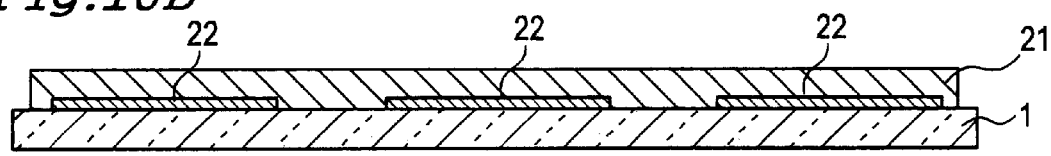

In the second step shown in FIG. 16B, a translucent conductive film 21 is then formed. When the conductive film 21 is formed using ZnO, the conductive film 21 is formed to a thickness of approximately 8000 Å.

Figure 16C:
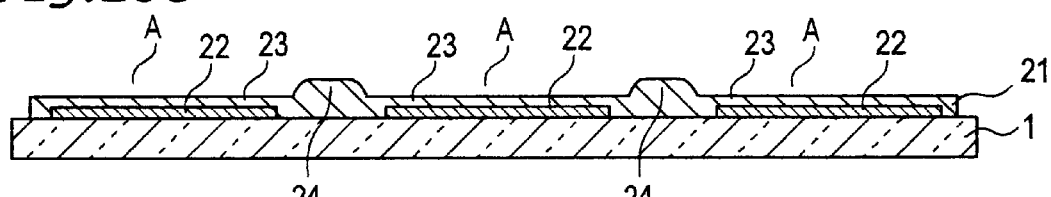

In the third step shown in FIG. 16C, etching using a solution of hydrochloric acid (HC1) is then performed. In the etching, a ZnO film in the element region A is etched faster than a ZnO film in a processing portion (a side end) B. Accordingly, an irregular surface serving as a texture plane is formed on a surface of the element region A, and the element region A is thinned.

Figure 16D:
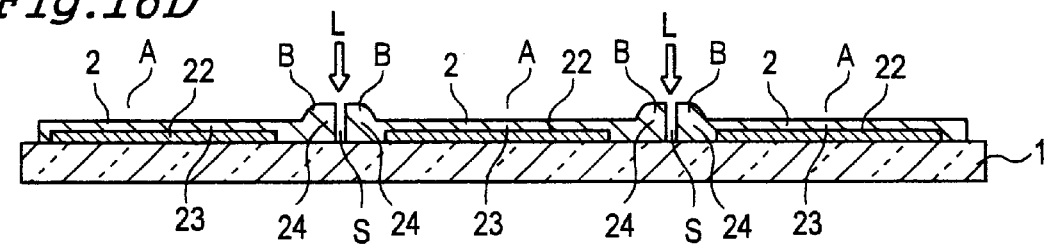

In the fourth step shown in FIG. 16D, the processing portion B is then irradiated with laser beams L, to remove the conductive film 21 having a good orientation in a portion irradiated with the laser beams L, thereby forming a separating trench S as well as forming a plurality of first electrodes 2 in a separated manner.

Figure 16E:
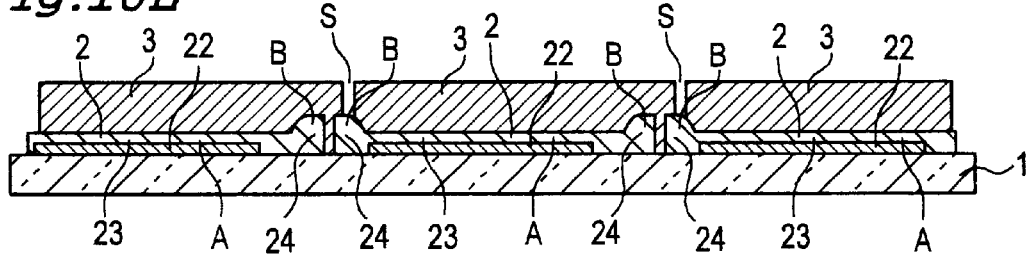

In the fifth step shown in FIG. 16E, a plurality of photovoltaic conversion layers 3 and second electrodes 4 are formed in the same manner as that in the first embodiment, thereby making it possible to fabricate a photovoltaic device having the structure shown in FIG. 6.

Also in the present embodiment, it is possible to provide a photovoltaic device having superior photovoltaic characteristics with a high yield, as in the above-mentioned first embodiment.

EXAMPLE 1

A specific example of the above-mentioned photovoltaic device according to the first embodiment of the present invention will be described below.

A glass substrate having dimensions of 10 cm×10 cm was first prepared, and a conductive film composed of ZnO having a thickness of 1 $\mu$m was formed on an approximately entire surface of the glass substrate using sputtering. The forming conditions of ZnO are as shown in Table 2.

TABLE 2

| target | ZnO: $Al_2O_3$ (2 wt. %) |
|---|---|
| sputtering gas | Ar: 5~50 sccm |
| RF power | 300~450 W |
| pressure | 0.5~1.0 Pa |
| substrate temperature | 100~250° C. |

A resist film was then formed on a removal region in a conductive film, and was immersed in a 1% solution of HC1 for approximately 30 seconds, to thin a region serving as an element region in the conductive film. In the step, only the region serving as the element region in the conductive film which was formed to a thickness of 1 $\mu$m was etched to a thickness of approximately 4000 Å, and an irregular surface in a pyramid shape was formed on its surface.

Nd : YAC lasers having a wavelength of 1.06 $\mu$m and having a pulse frequency of 3 kHz were used as laser beams, and were then irradiated into the removal region in the conductive film at a laser power density of $4 \times 10^7$ W/$cm^2$ and at a processing rate of 10 mm/sec. from the side of the substrate. The conductive film in a portion irradiated with the laser beams was removed, thereby forming a separating trench as well as forming a plurality of first electrodes in a separated manner.

Furthermore, a p-type layer having a thickness of approximately 150 Å composed of p-type amorphous silicon carbide, an i-type layer having a thickness of approximately 4000 Å composed of i-type amorphous silicon, and an n-type layer having a thickness of approximately 200 Å composed of n-type amorphous silicon were formed in this order on an approximately entire surface of the substrate, including the plurality of first electrodes, using plasma CVD, to form a plurality of photovoltaic conversion layers in a separated manner by laser patterning. The forming conditions of each of the amorphous semiconductor layers are as shown in Table 3.

TABLE 3

| | p layer | i layer | n layer |
|---|---|---|---|
| material gas | $SiH_4$: 200 sccm<br>$B_2H_6$: 10 sccm<br>$CH_4$: 100 sccm<br>$H_2$: 200 sccm | $SiH_4$: 400 sccm | $SiH_4$: 200 sccm<br>$PH_3$: 200 sccm |
| substrate temperature (° C.) | 200 | 200 | 200 |
| RF power (W) | 100 | 100 | 100 |
| pressure (Pa) | 100 | 100 | 100 |

Finally, an Ag film was formed on the approximately entire surface of the substrate, including the plurality of photovoltaic conversion layers, using sputtering, and a plurality of second electrodes were then formed in a separated manner by laser patterning, to fabricate an integrated photovoltaic device comprising photovoltaic elements in 10 stages electrically connected in series. The photovoltaic conversion characteristics of the photovoltaic device are shown in Table 4. For comparison, the characteristics of a photovoltaic device in a comparative example fabricated in the same steps as those in the example 1 except that the step of forming the conductive film composed of ZnO to a thickness of approximately 4000 Å as well as thinning the element region in the conductive film is not carried out.

TABLE 4

| | Voc/ stage | Isc (mA/ $cm^2$) | F.F. | conversion efficiency (%) | parallel resistance component ($\Omega$ $cm^2$) |
|---|---|---|---|---|---|
| example 1 | 1.53 | 9.7 | 0.71 | 10.5 | 7500 |
| comparative example | 1.53 | 9.4 | 0.63 | 9.1 | 600 |

As can be seen from Table 4, higher photovoltaic conversion efficiency is obtained in the device in the example 1. When a parallel resistance component between the photovoltaic elements is measured, the parallel resistance component is increased in the device in the example 1, as shown in Table 4, so that it is found that leak current is decreased. The following is the reason for this. The thickness of the removal region irradiated with the laser beams is approximately 1 $\mu$m in the device in the example 1, while being approximately 4000 Å in the device in the comparative example. Therefore, in the device in the comparative example, the conductive film is not sufficiently removed, and the undesired residual, for example, remains, so that it is considered that leak current is increased.

On the other hand, in the device in the example 1, the conductive film is sufficiently removed because the thickness of the removal region is large, i.e., approximately 1 $\mu$m. Accordingly, the leak current is decreased. Further, the thickness of the element region is in a range most suitable for improvement of efficiency. Therefore, it is considered that high photovoltaic conversion characteristics are obtained.

EXAMPLE 2

Description is made of a specific example of the above-mentioned photovoltaic device according to the second embodiment of the present invention.

In the example, a conductive film having a thickness of approximately 4000 Å composed of ZnO was formed on a substrate composed of glass by sputtering. The forming conditions of the conductive film are the same as those in the example 1. A laser beam absorbing member composed of $SnO_2$ was formed to a thickness of 2000 Å on a removal region in the conductive film.

YAG laser beams having a wavelength of 1.06 μm were then irradiated into the removal region in the conductive film from the side of the substrate, and the conductive film and the laser beam absorbing member in a portion irradiated with the laser beams were removed, forming a plurality of first electrodes in a separated manner.

Furthermore, a p-type layer having a thickness of approximately 150 Å composed of p-type amorphous silicon carbide, an i-type layer having a thickness of approximately 4000 Å composed of i-type amorphous silicon, and an n-type layer having a thickness of approximately 200 Å composed of n-type amorphous silicon were formed in this order on an approximately entire surface of the substrate 1, including the plurality of first electrodes, using plasma CVD, to form a plurality of photovoltaic conversion layers in a separated manner by laser patterning. The forming conditions of each of the amorphous semiconductor layers are the same as those used in the example 1.

Finally, an Ag film was formed on the approximately entire surface of the substrate, including the plurality of photovoltaic conversion layers, by sputtering, and a plurality of second electrodes were then formed in a separated manner by laser patterning, to fabricate an integrated photovoltaic device comprising photovoltaic elements in 10 stages electrically connected in series. The photovoltaic conversion characteristics of the photovoltaic device are shown in Table 5. The characteristics of the above-mentioned photovoltaic device in the comparative example are also shown.

TABLE 5

|  | Voc/stage | Isc (mA/cm$^2$) | F.F. | conversion efficiency (%) | parallel resistance component (Ω cm$^2$) |
| --- | --- | --- | --- | --- | --- |
| example 2 | 1.53 | 9.5 | 0.71 | 10.3 | 7300 |
| comparative example | 1.53 | 9.4 | 0.63 | 9.1 | 600 |

As can be seen from Table 5, higher photovoltaic conversion efficiency is obtained in the device in the example 2. When a parallel resistance component between the photovoltaic elements is measured, the parallel resistance component can be decreased in the device in the example 2, as shown in Table 5. The following is the reason for this. The thickness of the removal region in the conductive film irradiated with the laser beams is approximately 6000 Å by forming the laser beam absorbing member in the device in the example 2, while being approximately 4000 Å in the device in the comparative example. Therefore, in the device in the comparative example, the conductive film is not sufficiently removed, and the undesired residual, for example, remains, so that the parallel resistance component is decreased, as described above. As a result, it is considered that the photovoltaic conversion characteristics are degraded.

On the other hand, in the device in the example 2, the conductive film is sufficiently removed because the thickness of the removal region is large, i.e., approximately 6000 Å. Accordingly, the leak current is decreased. Further, the thickness of the element region is in a range most suitable for improvement of efficiency. Therefore, it is considered that high photovoltaic conversion characteristics are obtained.

A material composing the laser beam absorbing member is not limited to $SnO_2$, described above. Another material can be also used, provided that the material absorbs laser beams. Further, the laser beam absorbing member may be removed after the first electrodes are formed in a separated manner. Alternatively, the laser beam absorbing member may be left as it is without being removed, as in this example. In either case, the same effect is produced.

EXAMPLE 3

Description is made of a specific example of the above-mentioned photovoltaic device according to the third embodiment of the present invention.

A method of forming an insulation thin film 22 composed of $SiO_2$ in a predetermined region on glass will be described in accordance with FIG. 17.

Figure 17A:
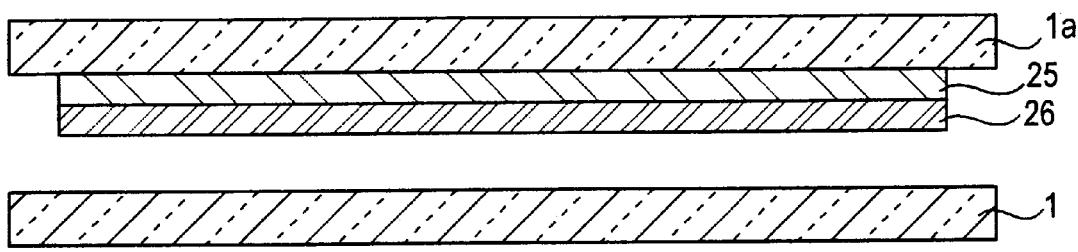
FIG. 17 is a cross-sectional view by steps for explaining a method of forming an insulation thin film in a predetermined region on a substrate.

In the step shown in FIG. 17A, an amorphous silicon layer 25 having a thickness of 300 Å is formed on glass 1a by CVD. An Ag film 26 having a thickness of 2000 Å is then formed on the amorphous silicon layer 25 by sputtering. The Ag film 26 and a film surface of a glass substrate 1 serving as a substrate are opposed to and made to adhere to each other.

Figure 17B:
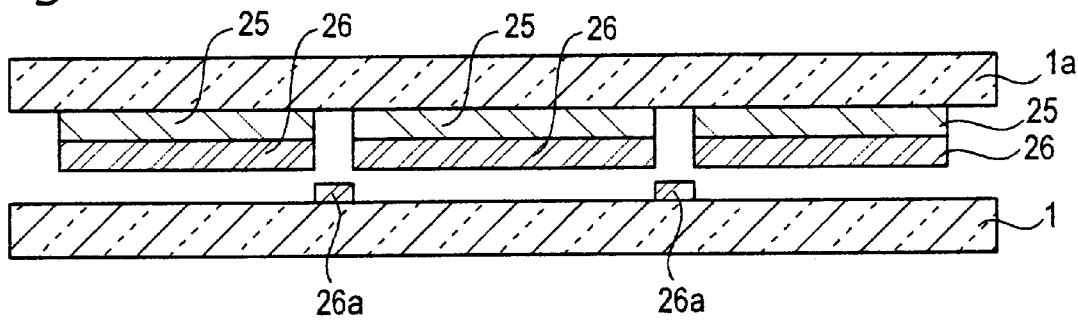

In the step shown in FIG. 17B, lasers are irradiated from the side of the glass 1a, to make an Ag film 26a to adhere on the substrate 1 in a line shape.

Figure 17C:
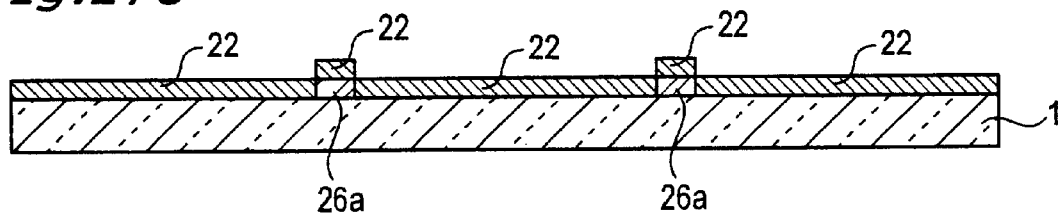

In the step shown in FIG. 17C, an $SiO_2$ film 22 having a thickness of 1000 Å is formed on the substrate 1, including the Ag film 26a in a line shape, by sputtering. The forming conditions of the $SiO_2$ film 22 are a temperature of 250° C., an RF power of 300 W, a ultimate pressure of $13.3 \times 10^{-6}$ Pa, and 50 sccm Ar as sputtering gas.

Figure 17D:
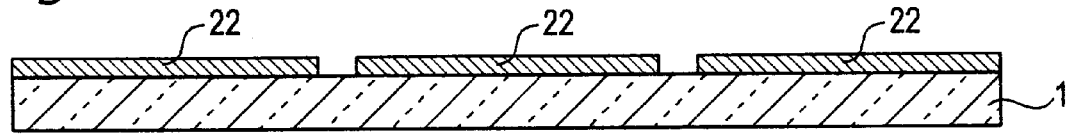

In the step shown in FIG. 17D, the substrate 1 to which the $SiO_2$ film 22 adheres is immersed in a 20% solution of hydrochloric acid (HCl) for 30 seconds. By immersing the substrate 1 in the hydrochloric acid, Ag melts, the $SiO_2$ film formed on Ag is removed, the $SiO_2$ film 22 remains on only a surface of a portion which is not positioned just below a portion irradiated with the lasers, and the $SiO_2$ film 22 is selectively formed on the substrate 1.

A glass substrate having an $SiO_2$ film selectively formed thereon, as described above, was prepared, and a conductive film composed of ZnO having a thickness of 8000 Å was formed on an approximately entire surface of the glass substrate using sputtering. The forming conditions of ZnO are as shown in Table 2, described above.

The glass substrate was then immersed in a 0.5% solution of HCl for approximately 110 seconds, to thin a region serving as an element region in the conductive film. In the step, a large part of the region serving as the element region in the conductive film formed on the $SiO_2$ film was etched. Accordingly, the element region has a thickness of approximately 3000 Å. Further, a laser processing region having no $SiO_2$ film has a thickness of 7000 Å. An irregular surface in a pyramid shape was formed on a surface of the laser processing region.

Nd: YAC lasers having a wavelength of 1.06 μm and having a pulse frequency of 3 kHz were used as laser beams, and were then irradiated into the removal region in the conductive film at a laser power density of $4 \times 10^7$ W/cm$^2$ and at a processing rate of 10 mm/sec. from the side of the substrate. The conductive film in a portion irradiated with the laser beams was removed, thereby forming a separating trench as well as forming a plurality of first electrodes in a separated manner.

Furthermore, a p-type layer having a thickness of approximately 100 Å composed of p-type amorphous silicon carbide, an i-type layer having a thickness of approximately 3000 Å composed of i-type amorphous silicon, and an n-type layer having a thickness of approximately 200 Å composed of microcrystalline silicon ($\mu$c-Si) were formed in this order on an approximately entire surface of the substrate, including the plurality of first electrodes, using plasma CVD, to form a plurality of photovoltaic conversion layers in a separated manner by laser patterning. The forming conditions of each of the amorphous semiconductor layers are as shown in Table 6.

TABLE 6

|  | p-type a-SiC layer | i-type a-Si layer | n-type $\mu$c-Si layer |
|---|---|---|---|
| material gas | $SiH_4$: 80 sccm 1% $B_2H_6/H_2$: 40 sccm $CH_4$: 20 sccm | $SiH_4$: 80 sccm | $SiH_4$: 40 sccm 1% $PH_3/H_2$: 20 sccm $H_2$: 100 |
| substrate temperature (° C.) | 250 | 250 | 250 |
| RF power (W) | 30 | 30 | 90 |
| pressure (Pa) | 50 | 50 | 50 |

Finally, an Ag film was formed on the approximately entire surface of the substrate, including the plurality of photovoltaic conversion layers, using sputtering, and a plurality of second electrodes were then formed in a separated manner by laser patterning, to fabricate an integrated photovoltaic device comprising photovoltaic elements in 10 stages electrically connected in series.

In the above-mentioned device in the example 3, the conductive film is sufficiently removed because the thickness of the removal region is large, i.e., approximately 7000 Å. Accordingly, leak current is decreased, and the thickness of the element region is in a range most suitable for improvement of efficiency. Therefore, high photovoltaic conversion characteristics are obtained, as in the device in the example 1.

Although in the above-mentioned embodiments, description was made of a case where a pin junction having as a constituent element amorphous silicon, amorphous silicon carbide, or microcrystalline silicon is applied to a single photovoltaic deice, it goes without saying that the same effect is obtained even in a photovoltaic device using a thin semiconductor film containing another constituent element, a laminated photovoltaic device including a plurality of pin junctions, and a semiconductor device having another structure.

As described in the foregoing, according to the present invention, it is possible to provide a photovoltaic device having high photovoltaic conversion characteristics with a superior yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising:
   a substrate;
   a plurality of first electrodes separated from one another by separating trenches on the substrate;
   a photovoltaic conversion layer provided on the substrate, including the first electrodes; and
   a plurality of second electrodes provided on the photovoltaic conversion layer and separated from one another by second separating trenches, wherein the second separating trenches extend downwardly and terminate at the first electrodes; and
   the thickness of side ends in the first electrodes in the vicinity of the separating trench existing between the first electrodes and an adjacent first electrode being larger than the thickness of an element region in the first electrodes.

2. The photovoltaic device according to claim 1, wherein the first electrode are composed of zinc oxide.

3. The photovoltaic device according to claim 1, wherein the first electrodes are divided into a plurality of parts by laser beam irradiation.

4. The photovoltaic device according to claim 2, wherein the thickness of the side ends in the first electrodes is not less than 5000 Å.

5. The photovoltaic device according to claim 2, wherein the thickness of the element region in the first electrodes is in the range of approximately 2100 Å to approximately 5000 Å.

6. The photovoltaic device according to claim 2, wherein a textured surface is formed in the element region in the first electrodes.

7. The photovoltaic device according to claim 6, wherein the element region in the first electrodes is made thinner than the side end when the textured surface is formed.

8. The photovoltaic device according to claim 1, wherein the thickness of the side ends in the first electrodes is formed by a laser beam absorbing member to be larger than the thickness of the element region.

9. A photovoltaic device comprising:
   a substrate;
   an insulation thin film provided in a portion corresponding to an element region on the substrate;
   a plurality of first electrodes formed on the substrate, including the insulation thin film, and separated from one another by separating trenches;
   a photovoltaic conversion layer provided on the substrate, including the first electrodes; and
   a plurality of second electrodes provided on the photovoltaic conversion layer and separated from one another by second separating trenches, wherein the second separating trenches extend downwardly and terminate at the first electrodes; and
   the thickness of side ends in the first electrodes in the vicinity of the separating trench existing between the first electrodes and an adjacent first electrode being larger than the thickness of the element region in the first electrodes.

10. The photovoltaic device according to claim 9, wherein the first electrodes are composed of zinc oxide.

11. The photovoltaic device according to claim 9, wherein the insulation thin film is selected from the group consisting of silicon dioxide ($SiO_2$), aluminum oxide ($Al_2O_3$), and titanium oxide ($TiO_2$).

12. The photovoltaic device according to claim 10, wherein a textured surface is formed on a surface of the first electrodes.

13. The photovoltaic device according to claim 12, wherein
the element region in the first electrodes is made thinner than the side end when the textured surface is formed.

14. A method of fabricating a photovoltaic device comprising on a substrate a plurality of photovoltaic elements each composed of a lamination body of a first electrode, a photovoltaic conversion layer, and a second electrode, comprising the steps of:
forming an electrode film on the substrate;
thinning a region serving as an element region in the electrode film;
irradiating laser beams into a separating region in the electrode film, and removing the electrode film in a portion irradiated with the laser beams, to form a plurality of first electrodes in a separated manner.

15. The method according to claim 14, wherein the electrode film is composed of zinc oxide.

16. The method according to claim 14, wherein the electrode film is formed to a thickness of not less than 5000 Å.

17. The method according to claim 14, wherein in the step of thinning the region serving as the element region in the electrode film, the thickness of the region serving as the element region is in the range of approximately 2100 Å to approximately 5000 Å.

18. The method according to claim 14, wherein in the step of thinning the region serving as the element region in the electrode film, a textured surface is formed on a surface of the region serving as the element region.

19. The method according to claim 14, wherein the step of thinning the region serving as the element region in the electrode film is carried out after the step of forming the plurality of first electrodes in a separated manner.

20. A method of fabricating a photovoltaic device comprising on a substrate a plurality of photovoltaic elements each composed of a lamination body of a first electrode, a photovoltaic conversion layer, and a second electrode, comprising the steps of:
forming an electrode film on the substrate;
providing a laser beam absorbing member on a separating region in the electrode film; and
irradiating laser beams into the laser beam absorbing member, removing the laser beam absorbing member in a portion irradiated with the laser beams, together with the electrode film just below the laser beam absorbing member, to form a plurality of first electrodes in a separated manner.

21. The method according to claim 20, wherein the electrode film is formed of zinc oxide, and is formed to a thickness of approximately 2100 Å to approximately 5000 Å.

22. A method of fabricating a photovoltaic device comprising on a substrate a plurality of photovoltaic elements each composed of a lamination body of a first electrode, a photovoltaic conversion layer, and a second electrode, comprising the steps of:
forming an insulation thin film in a region corresponding to an element region on the substrate wherein the element region and a remaining portion are provided on the substrate;
forming an electrode film on the substrate, including the insulation thin film;
etching the electrode film, to make the electrode film serving as the element region positioned on the insulation thin film thinner than the electrode film positioned in the remaining region; and
irradiating laser beams into a separating region in the electrode film, and removing the electrode film in a portion irradiated with the laser beams, to form a plurality of first electrodes in a separated manner.

23. The method according to claim 22, wherein the electrode film is formed of zinc oxide.

24. The method according to claim 23, wherein
the insulation thin film is selected from the group consisting of silicon dioxide ($SiO_2$), aluminum oxide ($Al_2O_3$), and titanium oxide ($TiO_2$).

25. The method according to claim 22, wherein the electrode film is formed to a thickness of not less than 5000 Å.

26. The method according to claim 22, wherein
in the step of etching the electrode film, the thickness of the region serving as the element region is in the range of approximately 3500 A to approximately 5500 A.

27. The method according to claim 22, wherein
in the step of etching the electrode film, a textured surface is formed on a surface of the electrode film.

* * * * *